(12) United States Patent
Ngan

(10) Patent No.: US 6,207,027 B1
(45) Date of Patent: *Mar. 27, 2001

(54) METHOD TO REDUCE OVERHEAD TIME IN AN ION METAL PLASMA PROCESS

(75) Inventor: Kenny King-tai Ngan, Fremont, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/847,233

(22) Filed: May 7, 1997

(51) Int. Cl.[7] .................................................. C23C 14/34
(52) U.S. Cl. ................................. 204/192.13; 204/192.12
(58) Field of Search .................... 204/298.07, 192.12, 204/192.26, 192.13, 298.08; 118/715; 364/528.17; 73/23.2, 23.24

(56) References Cited

U.S. PATENT DOCUMENTS

| | | |
|---|---|---|
| 4,500,408 * | 2/1985 | Boys et al. ....................... 204/192.12 |
| 4,892,615 | 1/1990 | Motta . |
| 5,057,201 | 10/1991 | Fujita et al. . |
| 5,178,739 * | 1/1993 | Barnes et al. .................... 204/298.08 |
| 5,220,515 | 6/1993 | Freerks et al. . |
| 5,322,605 * | 6/1994 | Yamanishi ....................... 204/298.07 |
| 5,525,199 | 6/1996 | Scobey . |
| 5,685,963 * | 11/1997 | Lorimer et al. ................. 204/298.03 |

OTHER PUBLICATIONS

ON–BOARD Cryopump Specifications, CTI–Cryogenics Helix Technology Corporation, pp. 1–1 – 1–4.

* cited by examiner

Primary Examiner—Nam Nguyen
Assistant Examiner—Gregg Cantelmo
(74) Attorney, Agent, or Firm—Thomason, Moser & Patterson

(57) ABSTRACT

The present invention provides a method of reducing the overhead time associated with a high density ion metal plasma process. The method provides flowing a gas at a first flow rate and exhausting the chamber at a constant rate so that the rate at which gases are exhausted from the chamber at a steady state equals the flow rate of gases into the chamber. Another method provides flowing a gas at a first rate and then at a second flow rate which is about equal to the rate at which the gas is exhausted from the chamber at a steady state.

18 Claims, 3 Drawing Sheets

METHOD TO REDUCE OVERHEAD TIME IN AN ION METAL PLASMA PROCESS

FIELD OF THE INVENTION

The present invention relates to a method and apparatus to reduce the overhead time associated with a high density ion metal plasma process.

BACKGROUND OF THE INVENTION

Modern semiconductor integrated circuits usually involve multiple layers separated by dielectric (insulating) layers, such as silicon dioxide or silica, often referred to simply as an oxide layer, although other materials are being considered for use as the dielectric. The layers are electrically interconnected by holes penetrating the intervening oxide layer which contact some underlying conductive feature. After the holes are etched, they are filled with a metal, i.e., aluminum or copper, to electrically connect the bottom layer with the top layer. The generic structure is referred to as a plug. If the underlying layer is silicon or polysilicon, the plug is a contact. If the underlying layer is a metal, the plug is a via.

Plugs have presented an increasingly difficult problem as integrated circuits are formed with an increasing density of circuit elements because the feature sizes have continued to shrink. The thickness of the oxide layer seems to be constrained to the neighborhood of 1 $\mu$m, while the diameter of the plug is being reduced from the neighborhood of 0.25 $\mu$m or 0.35 $\mu$m to 0.18 $\mu$m and below. As a result, the aspect ratios (the ratio of the depth to the minimum lateral dimension) of the plugs is being pushed to 5:1 and above.

As sizes continue to decrease, new processes are being developed to enable metal to be deposited in the small features. One process which has been developed is high density plasma physical vapor deposition referred to as an ion metal plasma process. This process is characterized in that a source coil driven by RF energy is disposed in the process chamber to ionize sputtered metal ions which are dislodged from a target in the chamber. An electrical bias connected to a susceptor on which a substrate is supported in the chamber capacitively couples energy to the substrate and redirects the ions at the substrate surface enabling small features to be filled with metal.

One problem encountered in ion metal plasma processes is that the process is preferably carried out at higher pressures than are typically used in physical vapor deposition processes. Typical ion metal plasma processes are carried out in a pressure range of about 15–30 mTorr. Higher process pressures require longer time to stabilize the gas in the chamber prior to processing and require a longer time to pumpdown the chamber prior to moving the substrate out of the chamber. Typically, a transfer chamber is connected to the process chamber via a slit opening and valve assembly and the transfer chamber is maintained at a high vacuum such as about $10^{-3}$ Torr or higher. As a result, the ion metal plasma chamber must be pumped down to a high vacuum following processing before opening the slit valve and moving the substrate into the transfer chamber.

The gas stabilization time and pumpdown time have heretofore been arbitrarily set and result in a high overhead time. As one example, FIG. 1 illustrates a titanium ion metal plasma process in which the gas stabilization time is 20 seconds, as indicated by interval 10, the pumpdown time following deposition is 10 seconds, as indicated by interval 12, and the total overhead time is 30 seconds. In this exemplary process, argon gas is flowed into the chamber at a rate of about 47 sccm during the gas stabilization step and the deposition step.

Therefore, there remains a need for a method to reduce the overhead time in a deposition process an optimize an ion metal plasma process. It would be preferable if the minimum overhead time associated with a particular chamber and process could be achieved.

SUMMARY OF THE INVENTION

The present invention provides a method to reduce the overhead time associated with a plasma process by flowing a gas into a process chamber at a first flow rate or at two different flow rates during gas stabilization and then pumping down the chamber following deposition. In one embodiment, gas is flowed into the chamber at a first rate and gas is exhausted from the chamber at a constant rate so that the flow of gas at a steady state equals the flow of gas into the chamber. The chamber pressure is monitored versus time to determine the point at which gas stabilization is achieved. In another embodiment, gas is first flow into the chamber at about the rate at a first rate initially higher than the rate at which the gas is exhausted from the chamber at steady state and then at a second rate about equal to the rate at which the gas is exhausted from the chamber at steady state. During chamber pumpdown following processing, a high vacuum pump pulls a vacuum in the chamber to achieve the desired vacuum in the chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

The Apparatus

Figure 2:
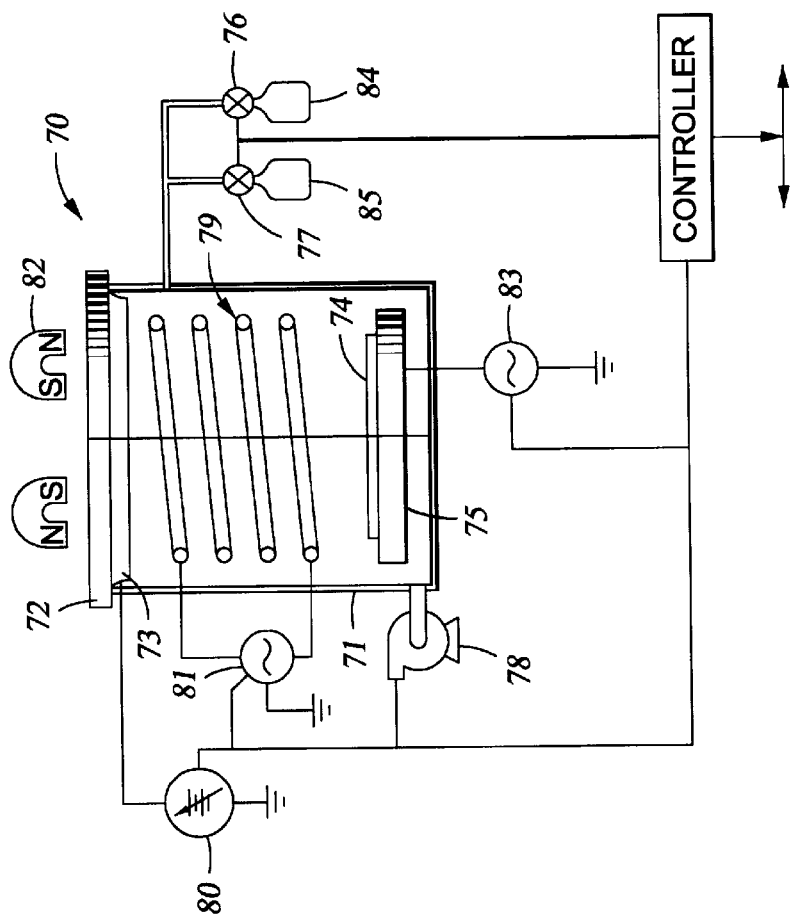
FIG. 2 is cross sectional view of an ion metal plasma process chamber.
Figure 1:
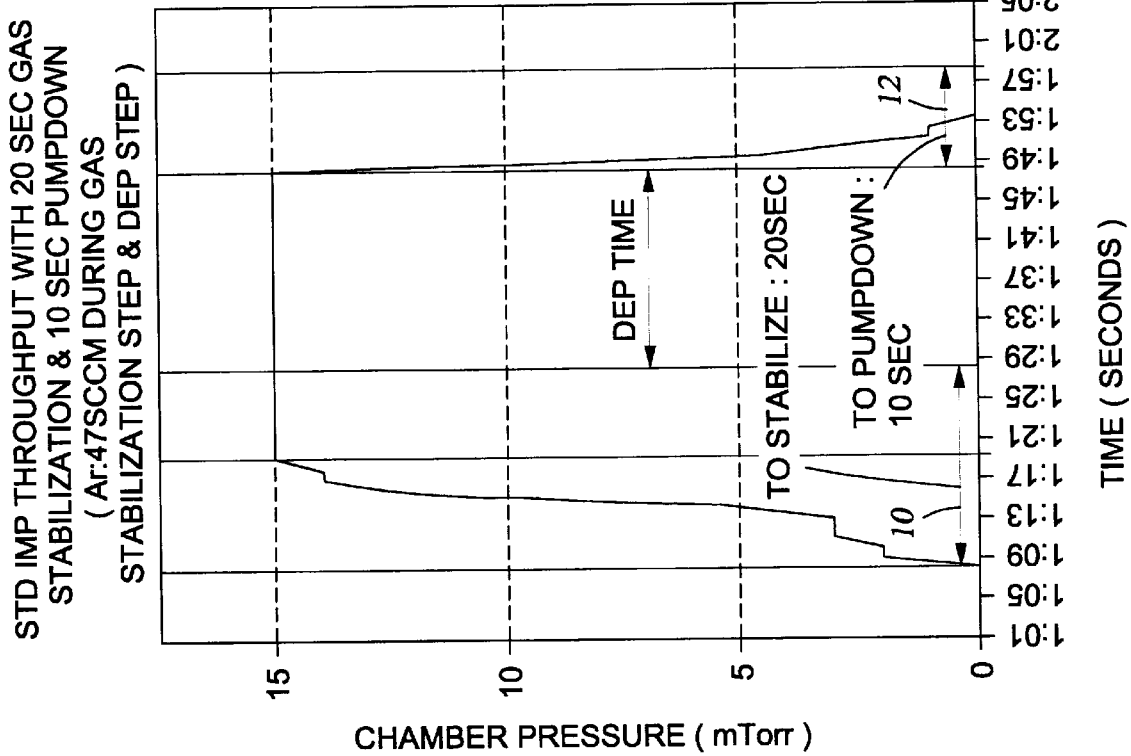
FIG. 1 is a graphical representation of the overhead time associated with a prior art process.

FIG. 2 is a schematic cross-sectional view of an ion metal plasma chamber 70 suitable for performing a PVD process of the present invention. As shown in this figure, which is meant only to be schematical, a vacuum chamber is defined principally by a chamber wall 71 and a target backing plate 72. A PVD target 73 is attached to the target backing plate and has a composition comprising at least part of the material being sputter deposited. For the deposition of both titanium (Ti) and titanium nitride (TiN), the target 73 is made of titanium. A substrate 74 being sputter deposited with a layer of a PVD film is supported on a pedestal electrode 75 in opposition to the target 73. Processing gas is supplied to the chamber 70 from gas sources 84, 85 as metered by respective mass flow controllers 76, 77 and a vacuum pump system 78 maintains the chamber 70 at the desired low pressure. The chamber shown has a volume of about 2,600 in$^3$. A CTI-CRYOGENICS ON-BOARD 8F High-Vacuum Pump is connected to the chamber to exhaust the chamber and maintain the desired chamber process pressure. A Sytec Inc. SEC-4400 mass flow controller regulates gas flow into the chamber.

An inductive coil 79 is wrapped around the space between the target 73 and the pedestal 75. Three independent power supplies are used in this type of inductively coupled sputtering chamber. A DC power supply 80 negatively biases the target 73 with respect to the pedestal 75. An RF power source 81 supplies electrical power in the megahertz range to the inductive coil 79. The DC voltage applied between the target 73 and the substrate 74 causes the processing gas supplied to the chamber to discharge and form a plasma. The RF coil power inductively coupled into the chamber 70 by the coil 79 increases the density of the plasma, that is, increases the density of ionized particles. Magnets 82 disposed behind the target 73 significantly increase the density of the plasma adjacent to the target 73 in order to increase the sputtering efficiency. Another RF power source 83 applies electrical power in the frequency range of 100 KHz to a few megahertz to the pedestal 75 in order to bias it with respect to the plasma.

Argon from the gas source 84 is the principal sputtering gas. It ionizes in the plasma, and its positively charged ions are attracted to the negatively biased target 73 with enough energy that the ions sputter particles from the target 73, that is, target atoms or multi-atom particles are dislodged from the target. The sputtered particles travel primarily along ballistic paths, and some of them strike the substrate 74 to deposit upon the substrate as a film of the target material. If the target 73 is titanium and assuming no further reactions, a titanium film is thus sputter deposited.

Figure 3:
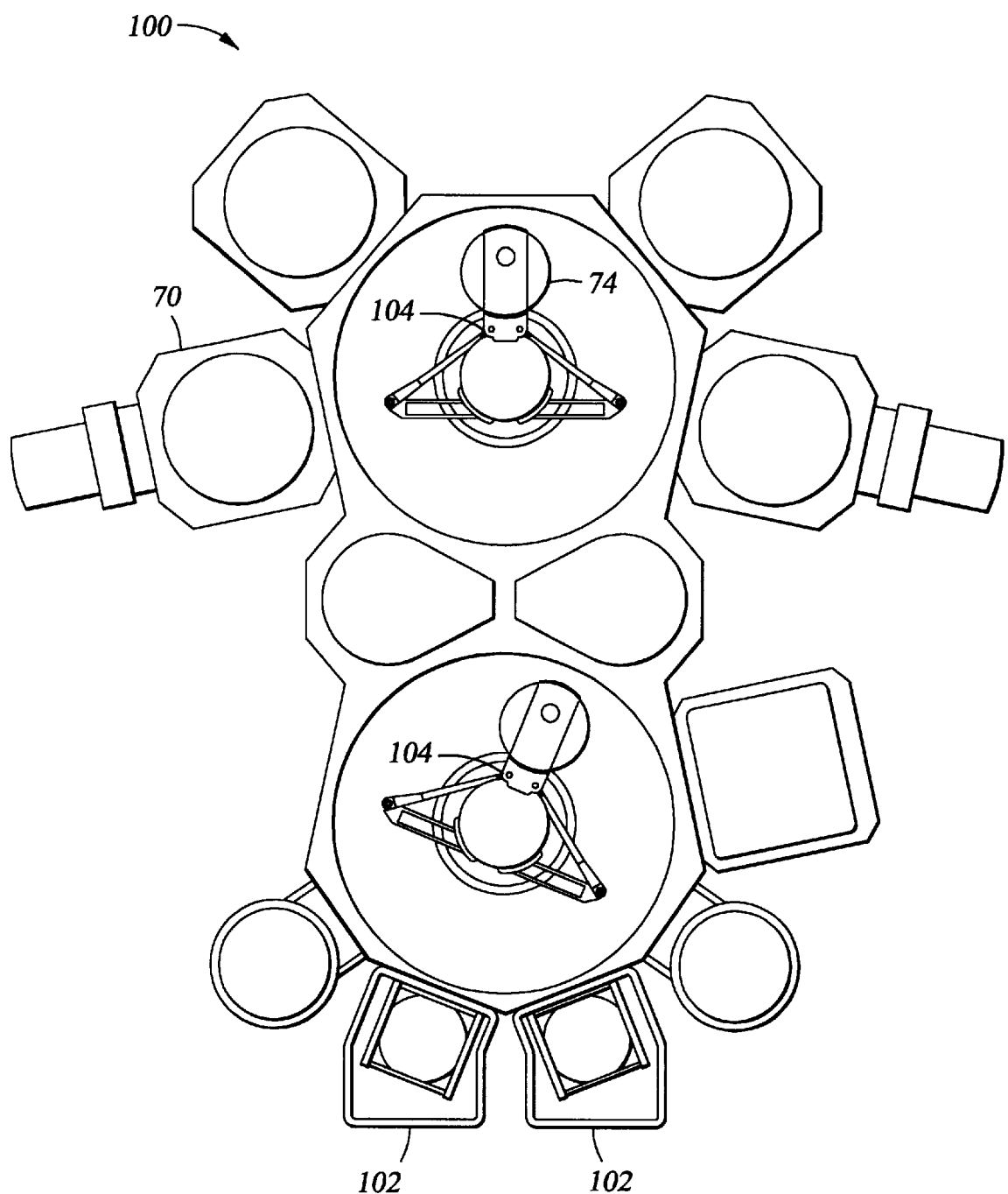
FIG. 3 is a schematic partial sectional view of a staged vacuum platform having a chamber suitable for performing a method of the present invention.

FIG. 3 is a schematic partial sectional view of a staged vacuum platform having a chamber 70 mounted thereon. Before a material layer can be sputtered onto the substrate 74, the substrate is typically passed through a load lock 102 communicating with a slit valve (not shown) in the enclosure wall 71 (as shown in FIG. 2), and positioned within the chamber 70 by a robot arm 104, blade or other substrate handling device (not shown) to be received on the support pedestal 75 (as shown in FIG. 2). The upper tips of the pins define a plane parallel to the upper surface of the pedestal (as shown in FIG. 2).

In a dynamic system, such as in the process chamber described above, gas is flowed into the chamber and the pressure is preferably held constant at a pre-determined process pressure. The pumping system is operated concurrently to achieve stabilization of the pressure and to maintain a steady pressure during the process step. This dynamic system can be defined by the ultimate pressure $p_{us}$ equation:

$$p_{us}=Q_g/S$$

where $Q_g$ is the gas load at almost constant rate and S is the pumping speed of the pump. The chamber pressure at stabilization is a balance point between constant gas flow into the chamber and constant pumping. The time needed to reach the balance point determines the gas stabilization time. A mass flowed controller allows the gas to be flown into the chamber at a constant rate or a variable rate as needed. In the examples described herein, the gas is argon and the pump is a cryogenic. However, the described embodiment is only representative of invention and should not be considered limiting of its scope.

The Processes

According to methods of the present invention, gas is flowed into the chamber at a selected rate or rates and the pumping system of the chamber exhausts the gas from the chamber at a constant rate. Prior to the gas being flowed into the chamber, the chamber is typically at a lower pressure/higher vacuum than the process pressure (e.g., from about $10^{-3}$ to about $10^{-9}$). Therefore, it is important that the gas be flowed into the chamber to increase the pressure in the chamber and that the gas be stabilized before the deposition process begins. This gas stabilization period along with post processing pumpdown time to re-establish the lower transfer pressure are typically referred to as the overhead time or the time during which the chamber is prepared for processing substrates. The present invention provides an optimum gas flow rate and/or flow rates and pumping speeds to reduce the overhead time associated with an ion metal plasma process. The chamber pressure at gas stabilization is a balance point between constant gas flow and constant pumping. The time to reach this balance point determines the gas stabilization time. The pumping of the chamber down to a vacuum level is achieved through a cryogenic pump or other high vacuum pump, typically a diffusion type pump. During gas stabilization, the gate valve between the chamber and the high vacuum pump of the described chamber configuration is set at mid-position to allow the chamber pressure to be maintained at about 15 mTorr or higher for ionization. During the pumpdown step following the deposition process, the gate valve is fully opened so that the pumping speed is maximized.

EXAMPLE 1

Figure 4:
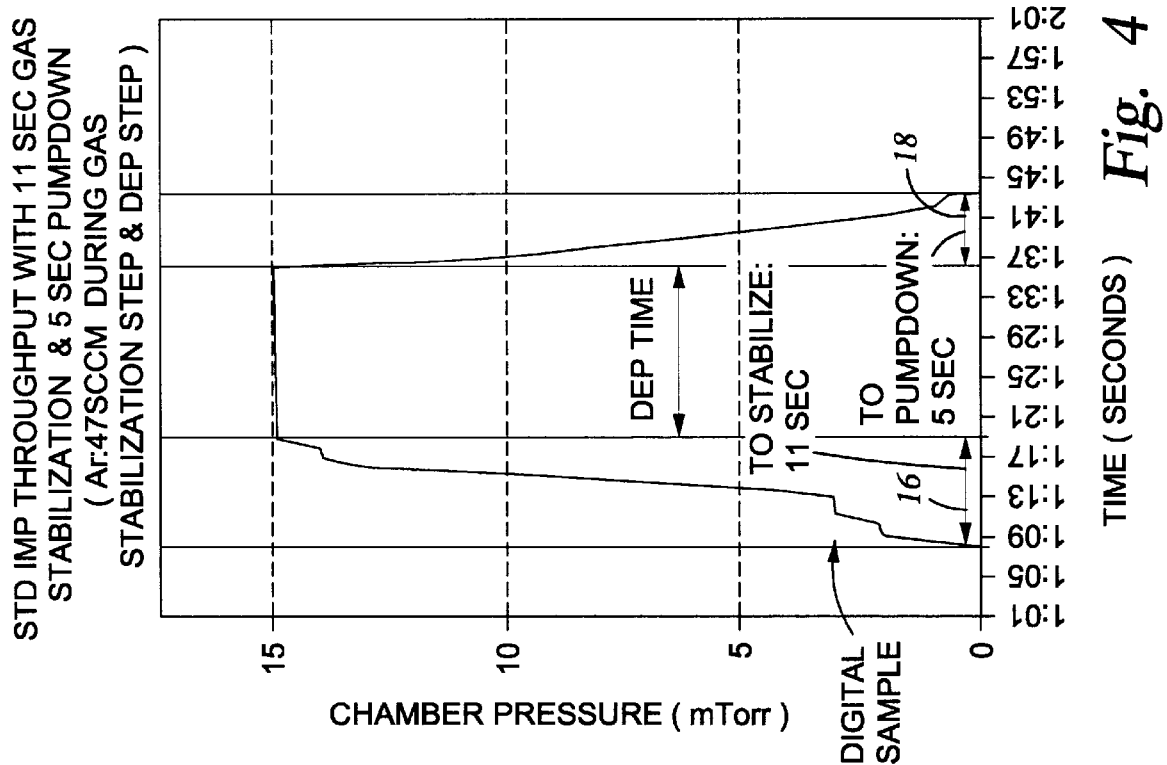
FIG. 4 is a graphical representation of the overhead time associated with one embodiment of the present invention.

In one embodiment shown graphically in FIG. 4, argon gas was flowed into a chamber, which was initially evacuated to about $10^{-3}$ Torr, at a rate of about 47 sccm during the gas stabilization step as indicated by interval 16, until the desired chamber pressure of 15 mTorr was achieved. The chamber used was described above and is available from Applied Materials, Inc. of Santa Clara, Calif. It was determined that an argon flow rate of 47 sccm in combination with the chamber described above and a CTI ON-BOARD 8F High-Vacuum Pump. A three position gate valve or other restrictor is generally used to reduce the pumping speed. The volume of the chamber used in this example was 2,600 in$^3$. The gate valve was set at the mid-position and the pumping speed was about 39.67 L/s at gas stabilization. The chamber pressure was monitored over time to determine the minimal process time needed to stabilize the chamber pressure using a one-step argon flow. The gas flow rate was maintained at about 47 sccm during a deposition step lasting about 20 seconds.

As shown graphically in FIG. 4, flowing argon into the chamber at about 47 sccm achieved gas stabilization in about 11 seconds. The deposition process was then be performed after the minimum gas stabilization period which was determined to be about 11 seconds.

Following the deposition step, the chamber was pumped down by fully opening the gate valve between the vacuum pump and the chamber and allowing the pump to operate at high speed. A minimum pump down time of 5 seconds was achieved, as indicated by interval 18. The total overhead time was then determined to be about 16 seconds, a drastic improvement over the 30 second overhead time associated with the earlier process.

EXAMPLE 2

Figure 5:
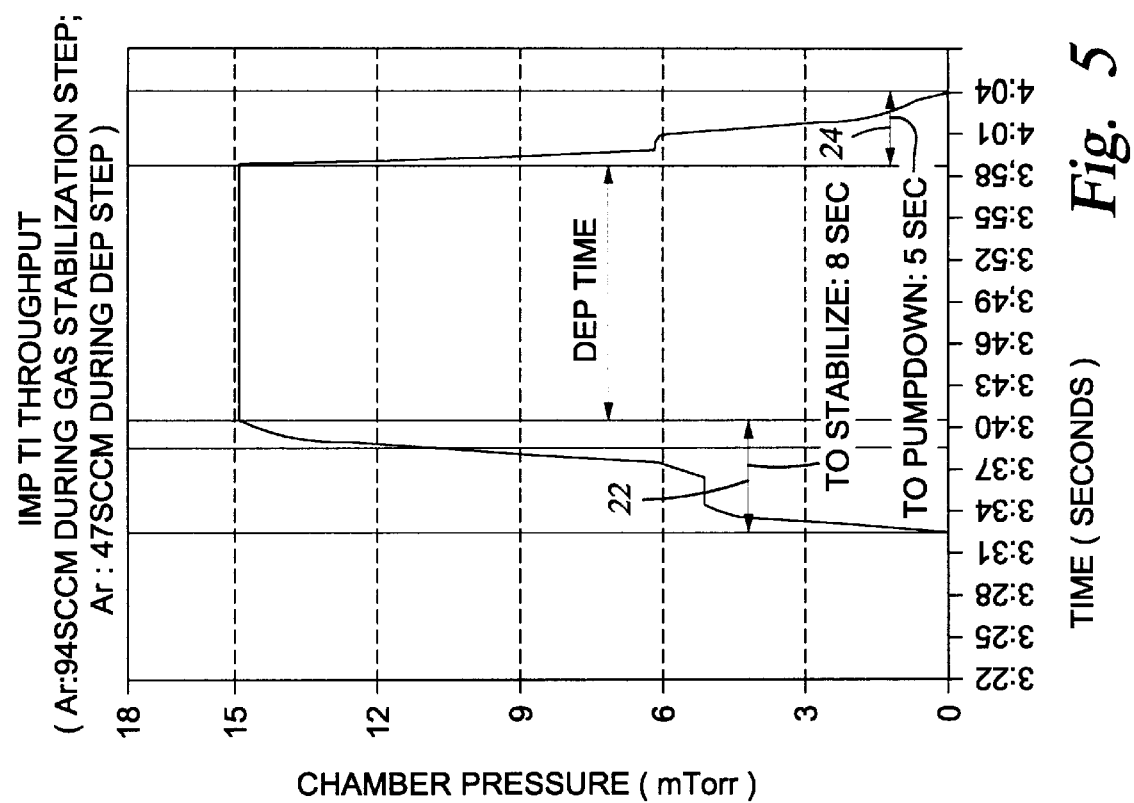
FIG. 5 is a graphical representation of the overhead time associated with another embodiment of the present invention.

In another embodiment shown graphically in FIG. 5, argon gas was initially flowed into the chamber at a rate of about 94 sccm for about 3 seconds and then at about 47 sccm thereafter at which time the desired process pressure was achieved and maintained in the chamber. The chamber set up was the same as that described in Example 1 except for the flow rates of argon.

As shown graphically in FIG. 5, initially flowing argon into the chamber at about twice the rate at which the process pressure can be maintained (e.g., 47 sccm for this system) achieved gas stabilization in about 8 seconds as indicated by interval 22.

The deposition process was then performed for about 20 seconds. Thereafter, the chamber was pumped down by fully opening the gate valve between the vacuum pump and the chamber and allowing the pump to operate at high speed. Again, a pumpdown time of 5 seconds was achieved as indicated by interval 24. The total overhead time for the two-step argon flow was then determined to be about 13.5 seconds.

Computer Control

The processes can be implemented using a computer program product that runs on a conventional computer system comprising a central processor unit (CPU) connected to a memory system with peripheral control components, such as for example a 68400 microprocessor, commercially available from Synenergy Microsystems, California. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of pre-compiled windows library routines. To execute the linked compiled object code, the system user invokes the object code, causing the computer system to load the code in memory, from which the CPU reads and executes the code to perform the tasks identified in the program.

A process gas control subroutine has program code for controlling process gas composition and flow rates. Generally, the process gases supply lines for each of the process gases, include (i) safety shut-off valves (not shown) that can be used to automatically or manually shut off the flow of process gas into the chamber, and (ii) mass flow controllers (also not shown) that measure the flow of a particular gas through the gas supply lines. When toxic gases are used in the process, the several safety shut-off valves are positioned on each gas supply line in conventional configurations. The process gas control subroutine controls the open/close portion of the safety shut-off valves, and also ramps up/down the mass flow controllers to obtain the desired gas flow rate. The process gas control subroutine is invoked by the chamber manager subroutine, as are all chamber component subroutines, and receives from the chamber manager subroutine process parameters related to the desired gas flow rates. Typically, the process gas control subroutine operates by opening the gas supply lines, and repeatedly (i) reading the necessary mass flow controllers, (ii) comparing the readings to the desired flow rates received from the chamber manager subroutine, and (iii) adjusting the flow rates of the gas supply lines as necessary. Furthermore, the process gas control subroutine includes steps for monitoring the gas flow rates for unsafe rates, and activating the safety shut-off valves when an unsafe condition is detected.

When the pressure control subroutine is invoked, the desired or target pressure level is received as a parameter from the chamber manager subroutine. The pressure control subroutine operates to measure the pressure in the chamber by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine can be written to open or close the gate valve to a particular opening size to regulate the chamber at the desired pressure.

While the foregoing is directed to the preferred embodiment of the present invention, other and further embodiments of the invention may be devised without departing from the basic scope thereof, and the scope thereof is determined by the claims which follow.

What is claimed is:

1. A method of reducing overhead time in a process chamber, comprising:
    a) introducing a substrate into the process chamber;
    b) flowing one or more gases into the process chamber at a first flow rate;
    c) simultaneously exhausting the chamber at a first exhaust rate; and
    d) monitoring a pressure in the chamber to determine an occurrence of a steady state pressure;
    e) initiating deposition of a layer on the substrate when the steady state is achieved.

2. The method of claim 1, further comprising:
    f) processing the substrate; and then
    g) exhausting the chamber at more than twice the first exhaust rate.

3. The method of claim 1, further comprising:
    f) processing the substrate; and then
    g) pumping the chamber at an exhaust rate greater than the first exhaust rate to lower the pressure in the chamber.

4. The method of claim 3, wherein g comprises pumping the chamber at more than twice the first exhaust rate.

5. The method of claim 3, further comprising:
    h) pumping the chamber down to a transfer pressure at which the substrate is transferred from the chamber; and
    i) monitoring the chamber pressure to determine when the transfer pressure is reached.

6. The method of claim 1, further comprising providing a coil disposed in the processing chamber and connected to a power source.

7. A method of processing a substrate, comprising:
    a) introducing a substrate into a chamber;
    b) flowing one or more gases into the chamber at a first inflow rate initially higher than an exhaust rate at which the chamber is being pumped;
    c) monitoring a pressure in the chamber to determine an occurrence of a steady state pressure; and
    d) initiating deposition of a layer on the substrate when the steady state is achieved.

8. The method of claim 7, wherein the steady state comprises flowing the one or more gases into the chamber at a second inflow rate equal to the exhaust rate.

9. The method of claim 7, wherein the first inflow rate is at least twice as high as a second inflow rate at which a process pressure is held substantially at the steady state.

10. The method of claim 7, further comprising:

e) pumping down the chamber.

11. The method of claim 8, further comprising:

e) pumping down the chamber.

12. The method of claim 7, further comprising:

e) pumping the chamber down to a transfer pressure at which the substrate is transferred from the chamber; and f) monitoring a chamber pressure to determine when the transfer pressure is reached.

13. The method of claim 7, further comprising providing a coil disposed in the processing chamber and connected to a power source.

14. A method of reducing overhead time in a process chamber, comprising:

a) pumping down the chamber to a pressure below a desired steady state pressure;

b) monitoring a chamber pressure to determine a point at which a process pressure is achieved;

c) exhausting the chamber at a first exhaust rate;

d) flowing one or more gases into the process chamber at a first flow rate greater than a second flow rate at which the process pressure can be maintained at the desired steady state pressure; then e) flowing the one or more gases into the process chamber at the second flow rate, and allowing the chamber to reach the steady state; and f) initiating deposition of a layer onto a substrate when the process pressure is achieved.

15. The method of claim 14, further comprising:

g) exhausting the one or more gases the chamber at a second exhaust rate at least about twice the first exhaust rate.

16. The method of claim 14, further comprising:

g) processing a substrate; and then h) exhausting the chamber at a second exhaust rate more than twice the first rate.

17. The method of claim 14, wherein the first flow rate is about twice the second flow rate and wherein the second flow rate is substantially equal to the first exhaust rate.

18. The method of claim 14, further comprising providing a coil disposed in the processing chamber and connected to a power source.

\* \* \* \* \*